(12) United States Patent
Antoszewski et al.

(10) Patent No.: US 7,541,584 B2
(45) Date of Patent: Jun. 2, 2009

(54) RESONANT CAVITY ENHANCED DEVICE AND A METHOD FOR FABRICATING SAME

(75) Inventors: Jarek Antoszewski, Perth (AU); John M Dell, Perth (AU); Lorenzo Faraone, Perth (AU); Charles A Musca, Perth (AU); Kevin J Winchester, Perth (AU)

(73) Assignee: The University of Western Australia, Nedlands (AU)

( * ) Notice: Subject to any disclaimer, the term of this patent is extended or adjusted under 35 U.S.C. 154(b) by 117 days.

(21) Appl. No.: 10/524,140

(22) PCT Filed: Aug. 13, 2003

(86) PCT No.: PCT/AU03/01020

§ 371 (c)(1),
(2), (4) Date: Nov. 10, 2005

(87) PCT Pub. No.: WO2004/015783

PCT Pub. Date: Feb. 19, 2004

(65) Prior Publication Data

US 2006/0118721 A1    Jun. 8, 2006

(30) Foreign Application Priority Data

Aug. 13, 2002  (AU)  .............................. 2002950739

(51) Int. Cl.
*H01L 27/14*    (2006.01)
(52) U.S. Cl. ............ 250/338.4; 250/338.1; 250/339; 250/341.8
(58) Field of Classification Search .............. 250/338.1, 250/339.11, 341.8, 338.4
See application file for complete search history.

(56) References Cited

U.S. PATENT DOCUMENTS 5,550,373  A    8/1996  Cole et al.

(Continued)

FOREIGN PATENT DOCUMENTS

EP    0 843 364 A1    5/1998

(Continued)

OTHER PUBLICATIONS

Supplementary European Search Report for EP 03 78 3853.9, May 23, 2007.

(Continued)

*Primary Examiner*—David P Porta
*Assistant Examiner*—Djura Malevic
(74) *Attorney, Agent, or Firm*—Nixon & Vanderhye, PC

(57) ABSTRACT

A detector device for detecting incident radiation at particular wavelengths is disclosed. The device includes a base layer comprising a substrate. A resonant cavity is formed on the base layer between a pair of reflectors. One reflector is formed by a first reflector layer disposed in fixed relationship with respect to the base layer and the other reflector is formed by a second reflector layer disposed on a membrane in substantially parallel relationship to the substrate. A detector is provided within the cavity to absorb incident radiation therein for detection purposes. By placing the absorbing layer of the detector within the resonant cavity, high quantum efficiency can be achieved using very thin absorbing layers, thus significantly reducing the detector volume and hence noise. Various different arrangements of the detector device and different methods of fabricating the same are also disclosed.

80 Claims, 7 Drawing Sheets

U.S. PATENT DOCUMENTS

| | | | |
|---|---|---|---|
| 6,013,912 A | 1/2000 | Pautrat et al. | |
| 6,148,016 A | 11/2000 | Hegblom | |
| 6,380,531 B1 | 4/2002 | Sugihwo et al. | |
| 6,400,738 B1* | 6/2002 | Tucker et al. | 372/20 |
| 6,590,710 B2 | 7/2003 | Hara et al. | |
| 6,875,975 B2* | 4/2005 | Faska et al. | 250/214.1 |
| 2001/0052566 A1 | 12/2001 | Hwang et al. | |
| 2002/0048301 A1* | 4/2002 | Wang et al. | 372/45 |
| 2004/0070768 A1* | 4/2004 | McDaniel et al. | 356/519 |

FOREIGN PATENT DOCUMENTS

| | | |
|---|---|---|
| EP | 1 126 256 | 8/2001 |
| EP | 1 126 256 A2 | 8/2001 |
| EP | 1 204 148 A2 | 5/2002 |
| JP | 2000-031510 A | 1/2000 |
| WO | 02/075263 | 9/2002 |

OTHER PUBLICATIONS

A. Dehe et al. "III-V Compound semiconductor micromachined actuators for long resonator tunable Fabry-Perot detectors", Elsevier Sensors and Actuators A 68 (1998) pp. 365-371.

Examination Report dated Jun. 4, 2008 in European Application No. 03 783 853.9.

* cited by examiner

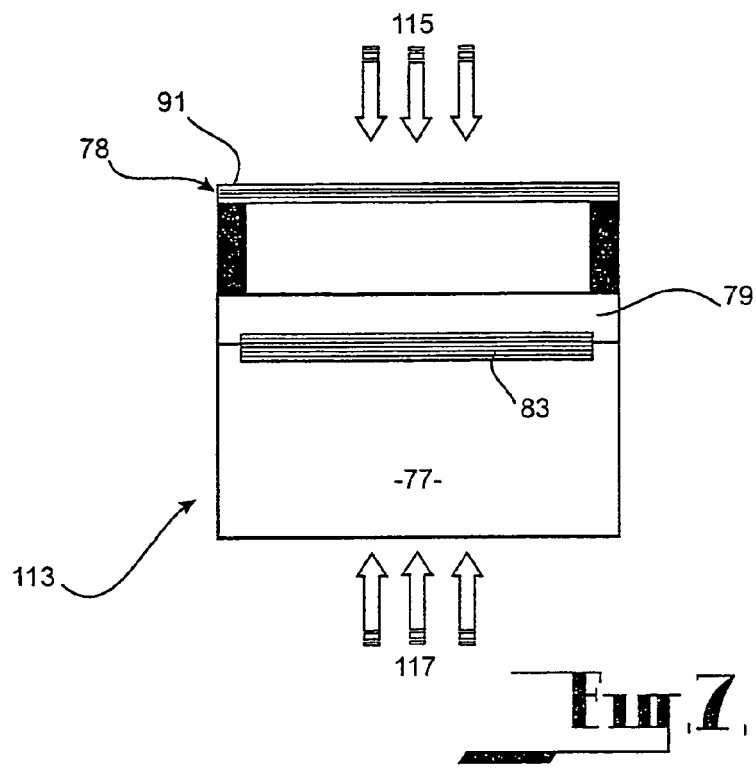
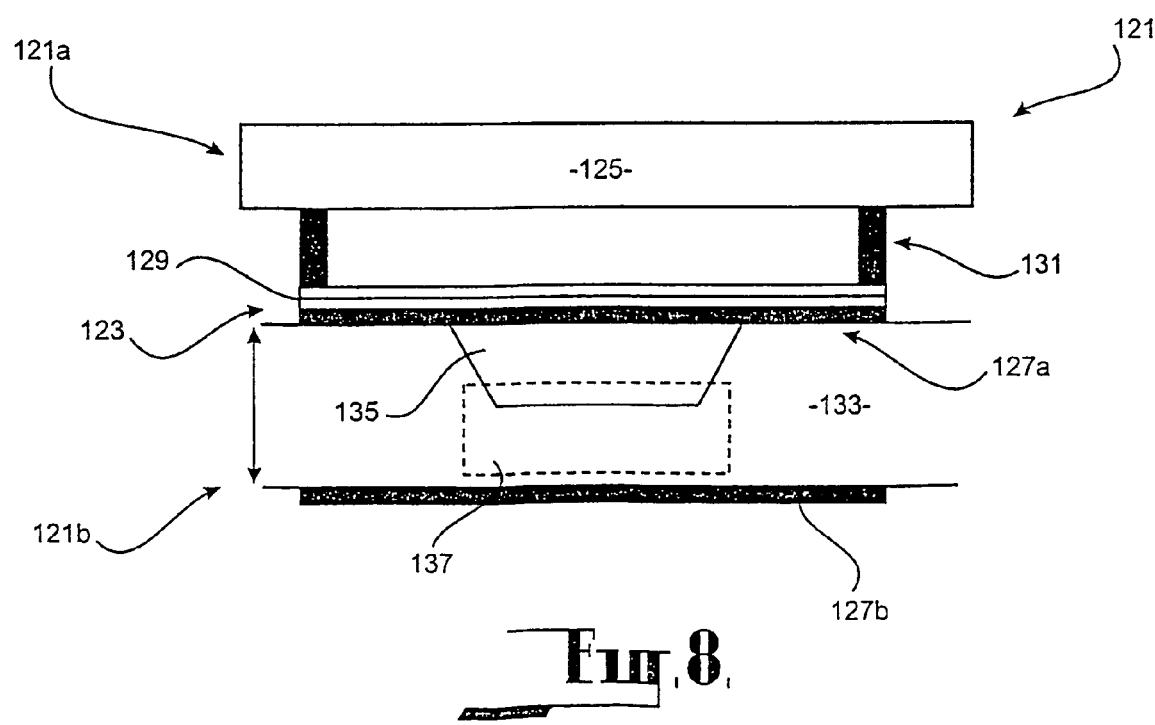

RESONANT CAVITY ENHANCED DEVICE AND A METHOD FOR FABRICATING SAME

This application is the US national phase of international application PCT/AU03/01020 filed 13 Aug. 2003 which designated the U.S. and claims benefit of AU 2002950739, dated 13 Aug. 2002, the entire content of which is hereby incorporated by reference.

FIELD OF THE INVENTION

This invention relates to the detection of incident radiation at particular wavelengths using resonant optical cavities. The invention has particular, although not exclusive, utility with detectors involving tunable resonant cavities fabricated using micro-electromechanical systems (MEMS) structures in the form of deformable suspended membranes suitable for, but not limited to, photonic purposes involving infrared (IR) electromagnetic radiation, where cavity resonance is used, and methods of fabricating the same.

The invention has application with semiconductor devices that can be used as tunable detectors, emitters and filters for wavelength division multiplexing (WDM), micro-spectrometry and other purposes.

Aspects of the invention may be employed as multi or hyperspectral systems, wavelength agile detector systems and detector systems that are blind to countermeasures.

Throughout the specification, unless the context requires otherwise, the word "comprise" or variations such as "comprises" or "comprising", will be understood to imply the inclusion of a stated integer or group of integers but not the exclusion of any other integer or group of integers.

BACKGROUND ART

The following discussion of the background art is intended to facilitate an understanding of the present invention only. It should be appreciated that the discussion is not an acknowledgement or admission that any of the material referred to was part of the common general knowledge as at the priority date of the application.

The integration of MEMS and infrared detector technology, where the MEMS structure is used as a resonant cavity to improve quantum efficiency, has the following applications:

High performance infrared detectors

High performance infrared detectors operating with reduced cooling requirements—high operating temperature (HOT) detectors Wavelength agile versions of the above applications.

International Patent Application PCT/AU03/00048 filed by the applicant describes, inter alia, the formation of n-p junctions, and particularly n-on-p junctions which has particular, but not exclusive, utility in the construction of infrared (IR) photodiodes and detectors that function as two-dimensional staring arrays fabricated using mercury cadmium telluride (MCT). Accordingly, the entire disclosure contained in International Patent Application PCT/AU03/00048 is incorporated herein by reference to constitute part of the disclosure of this specification.

International Patent Application PCT/AU03/00280 also filed by the applicant describes the application of MEMS structures with infrared wavelength detector technology to arrive at a tunable resonant cavity design having widespread utility not only in the field of infrared wavelength detector technology, but in other areas of electromagnetic filtering. Accordingly, the entire disclosure contained in International Patent Application PCT/AU03/00280 is also incorporated herein by reference to constitute part of the disclosure of this specification.

The specifications of the aforementioned international patent applications describe, inter alia, technology for the development of high performance mid-wavelength infrared (MWIR—3-5 µm) HgCdTe detectors, as well as long-wavelength infrared (LWIR, 8-12 µm) detectors using a reactive ion etching process to form n-on-p junctions. MWIR photodiodes developed according to the described processes give state of the art performance.

The specification for International Patent Application PCT/AU03/00280 also describes the development of low-temperature fabricated MEMS structures applicable to a wide range of semiconductor material systems that cannot withstand the high temperature processing usually required for MEMS devices. The invention has resulted in the development of new technologies for the fabrication of micro-machined optical micro-cavities with electrostatically actuated membrane mirrors as described in the specification. A cross-sectional view of a micro-machined Fabry-Perot cavity interferometer integrated with a photodiode formed according to the invention that is the subject of International Patent Application PCT/AU03/00280 to create a detector device with the detector externally disposed of the cavity is shown in FIG. 1. In the devices that can be fabricated in accordance with this invention, with specially designed supports, membrane movement of ~75 µm can be achieved using 50V bias without cracking of the membranes. Experiments on micro-cavities have also shown that changes in cavity length of more than 300 nm using voltages less than 5V can be achieved while maintaining mirror parallelism of better than ±5 nm over $100 \times 100$ µm$^2$.

The noise in the signal from current state-of-the-art IR photon detectors is related to generation-recombination mechanisms in the material forming such detectors, and is directly proportional to the detector volume. The optical area of the detector is generally set by the optical system requirements leaving device thickness as the only parameter available for optimisation of noise performance. Since the signal strength depends on the amount of absorption of photons, in a standard detector there exists an optimum thickness which results in a maximum signal to noise ratio.

DISCLOSURE OF THE INVENTION

It is an object of the present invention to provide for the detection of incident radiation where optical resonance is employed to enhance performance of the device.

It is a preferred object to provide for an improvement in the signal to noise ratio associated with the detection.

It is a further or alternative preferred object to provide for a reduction in the volume of semiconductor detectors, while maintaining quantum efficiency.

It is a further or alternative preferred object to provide for semiconductor detectors that can operate at higher temperatures.

The present invention is associated with the principle that if the absorbing layer of a detector device is placed within a resonant cavity, the nexus between device thickness and resultant signal strength is broken since the photon lifetime in the cavity at the resonant wavelength is very long. Because of this, high quantum efficiency can be achieved using very thin absorbing layers, thus significantly reducing the detector volume and hence noise.

In accordance with one aspect of the present invention, there is provided a detector device for detecting incident radiation at particular wavelengths, comprising:—
a base layer of material;
a cavity formed on said base layer, the cavity having a pair of reflectors, one being a first reflector layer disposed in fixed relationship with respect to the base layer and the other being a second reflector layer disposed in opposed spaced relationship to the first reflector layer to form a resonant cavity between the layers, the reflectors being disposed a cavity length from each other; and
a detector disposed within the cavity to absorb incident radiation therein for detection purposes.

Preferably, the first reflector layer and the second reflector layer are disposed in substantially parallel spaced relationship to each other.

Alternatively, the second reflector layer may be formed so that at least a portion of it is of slightly concave form with respect to the interior of the cavity.

Preferably, the surface of the detector for receiving incident radiation is provided with an anti-reflection (AR) coating to prevent Fresnel reflections therefrom that may otherwise form a complicated coupled multi-cavity structure, or alternatively, the detector may be formed as an integral part of the reflector structure.

Preferably, the base layer is a substrate, or alternatively, the base layer may comprise an integrated circuit.

In the case of the substrate, the substrate material may be a semiconductor or semiconductor system that is transparent to radiation in the wavelengths to be detected by the detector device.

Preferably, the cavity length corresponds to optical wavelengths in the infrared region.

Preferably, the detector is an active detector layer disposed in juxtaposition with the first reflector layer.

Preferably, the second reflector layer is formed on a moveable membrane disposed in spaced relationship to said base layer and suspended relative thereto at the periphery of the membrane by a support structure; and a pair of electrodes are provided to control the movement of said membrane, the electrodes either being constituted by the reflectors or being juxtaposed therewith, one electrode with the one reflector and the other electrode with the other reflector.

In one arrangement, the first reflector layer and the detector are integrated or integral with the base layer.

In one embodiment of this arrangement, it is preferred that the membrane is suspended by a support structure that is mounted upon a further base layer disposed in opposing, spaced relationship to the detector by support means.

Preferably, the further base layer comprises a readout integrated circuit.

Preferably, the support means comprises indium bumps that form part of the connection between the readout integrated circuit of the device and the detector.

In another embodiment of this arrangement, it is preferred that the membrane is suspended by a support structure that is mounted upon the detector or the base layer of the device.

Preferably, the first reflector layer is disposed on the surface of the base layer and is embedded between the detector and the base layer.

Alternatively, it is preferred that the detector together with the first reflector layer is embedded within the substrate on one side thereof so that the detector is exposed on one side of the substrate and the first reflector layer is disposed within the substrate to be integral therewith, and the other side of the substrate having a window therein down to the detector and the first reflector layer to reveal the first reflector layer from the other side of the substrate to enable the passage of radiation therethrough.

In a further alternative, the first reflector layer is preferred to be disposed on another detector having a different wavelength sensitivity to incident radiation than the first detector, so that the first reflector layer is interposed between the two detectors, and the other detector is disposed on the base layer.

Preferably, the other detector is of a shorter wavelength sensitivity to incident radiation to be detected than the first detector, and the base layer is a substrate.

In this manner, the longer wavelength first detector is tunable by moving the membrane of the second reflector layer, and the shorter wavelength other detector is fixed.

Alternatively, in the further alternative, another reflector layer is provided in juxtaposition with the base layer, interposed between the other detector and the base layer, to define another cavity between the second reflector layer and the other reflector layer. In this manner a plurality of cavities are formed which are conjunctively tunable by moving the membrane of the second reflector layer.

Preferably, the other detector is of a longer wavelength sensitivity to incident radiation to be detected than the first detector.

In another arrangement, the first reflector layer and the detector are preferably discrete from the base layer, whereby the second reflector layer and the moveable membrane are interposed between the detector and the base layer.

Preferably, the detector forms part of a homogeneous layer of material having the first reflector juxtaposed on one side thereof, distal from the base layer, and the second reflector juxtaposed on the other side thereof, proximal to the base layer, whereby a recess is formed within the homogeneous layer of material adjacent to the second reflector layer to form an air gap within the cavity, and the detector is defined by the residual homogeneous layer of material disposed between the recess and the first reflector layer.

In either arrangement, preferably, the membrane and one reflector is shaped in accordance with a prescribed membrane geometry.

Preferably, the displacement of the suspended moveable membrane can be up to the full length of the air gap provided in the cavity, but is adjusted to avoid the membrane contacting the reflector, detector or the readout integrated circuit, depending upon the particular detector arrangement.

Preferably, the membrane is formed of silicon nitride.

Preferably, the support structures are formed of zinc sulphide.

Preferably, the substrate is formed from an infrared sensitive material.

Preferably, the substrate is formed of mercury cadmium telluride (MCT).

In another embodiment, it is preferred that the electrodes are formed separately of the reflective layers.

In a further embodiment, it is preferred that the reflective layers are formed to function as electrodes.

In accordance with another aspect of the present invention, there is provided a method for fabricating a detector device for detecting incident radiation at particular wavelengths, comprising:—
providing a base layer of material;
forming one reflector in fixed relationship with respect to the base layer;
forming another reflector in opposed spaced relation to the one reflector so as to form a resonant cavity between the pair of reflectors, the reflectors being disposed a cavity length from each other; and forming a detector to be disposed within the cavity for absorbing incident radiation therein for detection purposes.

Preferably, the method includes disposing the one reflector and the other reflector in substantially parallel spaced relationship to each other.

Alternatively, the method may include forming the other reflector so that at least a portion of it is of slightly concave form with respect to the interior of the cavity.

Preferably, the method includes coating the surface of the detector that receives incident radiation with an anti-reflection (AR) coating to prevent Fresnel reflections therefrom that may otherwise form a complicated coupled multi-cavity structure, or alternatively forming the detector as an integral part of the reflector structure.

Preferably, the base layer is a substrate, or alternatively, the base layer may comprise an integrated circuit.

In the case of the substrate, the substrate material may be a semiconductor or semiconductor system that is transparent to radiation in the wavelengths to be detected by the detector device.

Preferably, the cavity length corresponds to optical wavelengths in the infrared region.

Preferably, the method includes:
forming a moveable membrane;
suspending the membrane at the periphery thereof with a support structure so that it is disposed in spaced relationship to the base layer;
forming the other reflector on the moveable membrane; and
providing a pair of electrodes to control the movement of the membrane, the electrodes either being constituted by the reflectors or being juxtaposed therewith, one electrode with the one reflector and the other electrode with the other reflector.

In one arrangement, the method includes forming the one reflector and the detector so that they are integrated or integral with the base layer.

According to one embodiment of this arrangement, preferably the method includes:
growing a first reflector layer on the base layer to form the one reflector of the cavity resonator;
growing an active detector layer on the one reflector to form one side of the detector device;
forming a second reflector layer on a further base layer to form the other reflector of the cavity resonator and the other side of the detector device;
conjoining the sides of the detector device relative to each other so that the one reflector is disposed in confronting relationship with the other reflector and the reflectors are spaced apart, with the detector disposed therebetween; and
bonding the two sides together to form an integral detector device with the reflectors disposed in spaced apart relationship to each other to form the resonant cavity with the detector disposed therein.

Preferably, the method includes forming support means on one side or the other of the detector device to space the reflectors apart when conjoining one side relative to the other.

Preferably, the further base layer comprises a readout integrated circuit.

Preferably, the support means are indium bumps.

Preferably, the converging and bonding involve a flip-chip bonding process.

Preferably, the one reflector is epitaxially grown as a wide bandgap dielectric stack prior to growth of the active detector layer or layers.

Preferably, the one reflector is an MCT/cadmium telluride (CdTe) $\lambda/4$ dielectric stack.

Preferably, the method includes suspending the other reflector upon the further base layer.

Preferably, the method includes forming the other reflector on, or as, a moveable membrane disposed in opposing, spaced relationship to the further base layer and suspended relative thereto at the periphery of the membrane by a support structure.

According to another embodiment of this arrangement, preferably the method includes: forming the membrane so that it is suspended by a support structure mounted upon the detector or base layer of the device.

Preferably, the method includes growing a first reflector layer on the surface of the base layer to constitute the one reflector, and depositing the detector thereon so that the first reflector layer is embedded between the base layer and the detector;

Alternatively, the method preferably includes:
embedding the detector in one side of the base layer;
etching a window in the base layer from the other side thereof down to the detector to reveal the rear thereof;
depositing a first reflector layer on the rear of the detector to form the one reflector of the cavity resonator; and
forming a second reflector layer disposed in opposing relationship to the base layer to form the other reflector of the cavity resonator.

Preferably, the method includes suspending the other reflector upon the base layer.

In a further alternative, the method preferably includes:
depositing another detector on the base layer;
growing a first reflector layer on the other detector to form the one reflector of the cavity resonator;
depositing the first detector on the first reflector layer and the other detector so that the first reflector layer is interposed between the two detectors; and
forming a second reflector layer in opposing, spaced relationship to the first detector to form the other reflector of the cavity resonator;

wherein the other detector has a different wavelength sensitivity to incident radiation than the first detector.

Preferably, the other detector is of a shorter wavelength sensitivity to incident radiation to be detected than the first detector, and the base layer is a substrate.

In this manner, a multi-spectral detector device is provided for simultaneously detecting incident radiation of a plurality of wavelengths, whereby the longer wavelength first detector is provided within a resonant cavity enhanced device and is tunable by moving the membrane of the second reflector layer, and the shorter wavelength other detector is fixed.

In another alternative still, the method preferably includes:
growing another reflector layer on the base layer to form a further reflector of a second resonator cavity within the device;
depositing a another detector on the other reflector layer so that the other reflector layer is interposed between the other detector and the base layer;
growing a first reflector layer on the other detector to form the one reflector of the first resonant cavity within the device;
depositing the first detector on the first reflector layer and the other detector so that the first reflector layer is interposed between the first detector and the other detector; and forming a second reflector layer in opposing, spaced relationship to the first detector to form the other reflector of both cavity resonators;

wherein one cavity is defined between the first reflector layer and the second reflector layer, and another cavity is defined between the other reflector layer and the second reflector layer.

In this manner, a multi-spectral detector device is provided for simultaneously detecting incident radiation of a plurality of wavelengths using a plurality of cavities, which are conjunctively tunable by moving the membrane of the second reflector layer.

Preferably, the other detector is of a longer wavelength sensitivity to incident radiation to be detected than the first detector.

In this manner, the shorter wavelength first detector is provided within a resonant cavity enhanced device being the one cavity, and the longer wavelength further detector is also provided within a resonant cavity enhanced device being the other cavity, both cavities being simultaneously tunable by moving the membrane of the second reflector layer.

In another arrangement, the method preferably includes:

forming: (i) a first reflector layer upon one side of a layer of homogeneous material sensitive to the incident radiation at the wavelength(s) to be detected to form the one reflector of the resonant cavity; and (ii) the detector within the layer of homogeneous material with an air gap to expose the detector to the other side of the homogeneous material; the first reflector layer and the detector being formed discretely from the base layer to constitute a first half of the device;

forming: (i) the moveable membrane; and (ii) a second reflector layer to form the other reflector of the resonant cavity thereon; on the base layer so that the second reflector layer, the moveable membrane and the base layer constitute a second half of the device discrete from the first half of the device; and conjoining the first half and the second half of the device so that the second reflector layer is juxtaposed and bonded to the other side of the layer of homogeneous material;

whereby the second reflector layer and the moveable membrane surmounts the air gap and the detector to form the cavity with the detector disposed therein.

Preferably, the method of this arrangement includes:

growing the first reflector layer on one side of the layer of homogeneous material to be distal from the base layer in the end device;

etching the other side of the layer to form a recess that constitutes the air gap of the resultant cavity, the residual material disposed between the recess and the first reflector layer defining the detector; and juxtaposing the second reflector layer on the other side of the layer of homogeneous material so that it is proximal to the base layer.

Preferably, the method according to either arrangement further includes:

forming a sacrificial layer of a prescribed material on the base layer, the material having a high etch selectivity for releasing the membrane in a suspended and spaced relationship from the base layer, as appropriate;

forming the membrane on the sacrificial layer using a deposition technique characterised by providing the required intrinsic stress in the membrane;

depositing the second reflector layer on the membrane to form the other reflector;

patterning the further layer in accordance with a prescribed membrane geometry;

etching the second reflector layer to achieve said prescribed membrane geometry;

initially etching the sacrificial layer to remove regions thereof down to the base layer, as appropriate, exposed by said etching;

protecting those regions of the sacrificial layer intended to function as the residual support structure of the membrane; and finally etching the remaining unprotected regions of the sacrificial layer and removing the protection from said support structures to suspend the membrane in spaced relation to the base layer.

Preferably, the membrane is formed of silicon nitride.

Preferably, the sacrificial layer is formed of zinc sulphide.

Preferably, the substrate is formed from an infrared sensitive material.

Preferably, the readout substrate is formed of silicon.

Preferably, the deposition technique for forming the membrane is plasma enhanced chemical vapour deposition (PECVD).

Optionally, the electrodes may be formed separately of the reflective layers.

Alternatively, the reflector layers may be formed to function as electrodes.

Preferably, the second reflector layer is etched using an anisotropic etching process.

Preferably, the anisotropic etching process for the second reflector layer involves dry etching.

Preferably, the dry etching involves plasma etching.

Preferably, the plasma etching is reactive ion etching.

Preferably, the sacrificial layer is initially etched using an anisotropic etching process.

Preferably, the anisotropic etching process for initially etching the sacrificial layer involves dry etching.

Preferably, the protection of the support structures is provided by photoresist.

Preferably, the remaining unprotected regions of the sacrificial layer are finally etched using an isotropic etching process.

Preferably, the isotropic etching process involves a final release wet etch that undercuts the remaining membrane.

In accordance with another aspect of the present invention, there is provided a detector device fabricated according to the method defined in the preceding aspect of the invention.

BRIEF DESCRIPTION OF THE DRAWINGS

The following drawings relate to the ensuing description of the best mode for carrying out the invention with respect to several specific embodiments. The description is made with reference to the following drawings wherein:—

FIG. 2 shows a series of different types of detectors, wherein:

FIG. 7 is a minor variation of the second embodiment;

FIG. 8 is a schematic cross-sectional view of a detector device according to a fourth embodiment;

BEST MODE(S) FOR CARRYING OUT THE INVENTION

The best mode for carrying out the invention will now be described with respect to three specific embodiments and 2 minor variations thereto. Before describing the embodiments in detail, however, reference will be made to FIG. 1 of the drawings for the purposes of describing the method of fabricating a tunable cavity resonator of the type described in the applicant's International Patent Application PCT/AU03/00280, which method forms part of the description of each of the embodiments of the present invention.

Figure 1:
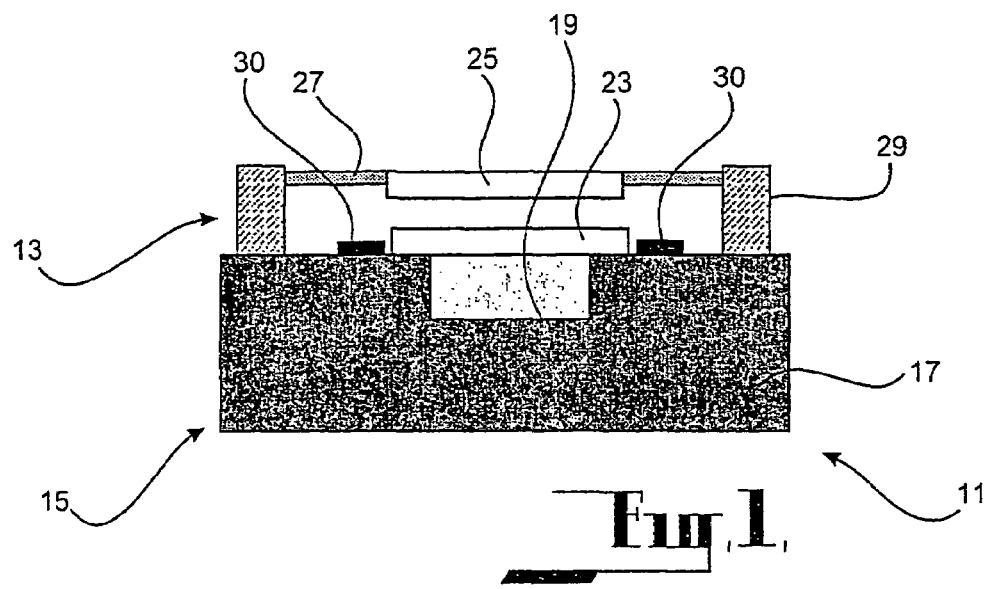
FIG. 1 of the drawings is a schematic cross-sectional view of a micro-machined Fabry-Perot cavity interferometer integrated with a photodiode that is the subject of International Patent Application PCT/AU03/00280, which forms part of the disclosure of the present specification.

As shown in FIG. 1 of the drawings, a detector device 11 comprises a tunable cavity resonator 13 surmounting a photodiode detector 15. The detector 15 comprises a substrate 17 formed of p-type semiconductor material with an n-on-p diode junction 19 formed therein, the n-type material 21 being formed using an appropriate technique such as reactive ion etching (RIE). The n-on-p junction functions as a photodiode, which is connected to appropriate electrodes (not shown) to constitute an IR detector. A first reflector layer 23 is deposited on the n-type material to form a lower mirror of the cavity resonator 13 in fixed relationship with the substrate 17. The remainder of the cavity resonator 13 is formed by a second reflector layer 25 deposited on a moveable membrane 27 suspended at its periphery by a support structure 29 above the detector 15 so that the second reflector layer is disposed to form an upper moveable mirror in a substantially parallel spaced relationship with the first reflector layer 23, the mirrors being spaced a cavity length apart from each other. The mirrors formed by the reflectors 23 and 25 constitute electrodes to control the movement of the membrane 27 by an electrostatic force applied thereto in response to an applied voltage across the electrodes. The applied voltage to the electrodes electrostatically attracts the mirrors towards each other a relative amount. Other arrangements, however, may be provided where force plate electrodes are disposed in a manner so that when a voltage is applied across the electrodes, the moveable mirror moves away from the static mirror a relative amount, proportional to the applied bias. These particular arrangements will be described in subsequent embodiments of the invention.

A pair of electrodes 30 are deposited upon the detector 15 to connect to either side of the n-p junction 19 and to readout electronics to provide an electronic signal proportional to the amount of radiation absorbed by the detector after passing through the cavity resonator. One of the electrodes is a force plate electrode for connecting to the force plates, and the other is for contacting the detector.

The second reflector layer 25 and the membrane 27 are precisely shaped in accordance with a prescribed membrane geometry so that the periphery of the membrane adjoining the support structure 29 functions as a spring to facilitate movement and tuning of the membrane to the requisite cavity length whilst maintaining the second reflector layer 25 in substantially parallel relationship to the first reflector layer 23 throughout the range of movement of the membrane.

The displacement of the suspended moveable membrane can be up to the full cavity length, but is adjusted to avoid the membrane contacting the one reflector. Using the fabrication processes described in the specification of International Patent Application PCT/AU03/00280, membrane movement of ~75 µm can be achieved using 50V bias without cracking of the membranes. Furthermore, changes in cavity length of more than 300 nm using voltages less than 5V can be achieved while maintaining mirror parallelism of better than ±5 nm over 100×100 µm$^2$.

The process for fabricating the detector device initially involves depositing the first reflector layer 23 on the surface of the n-type material 21, overlapping with the p-type material of the detector 15 to form the lower mirror of the cavity resonator, and then forming a sacrificial layer of a prescribed material on the resultant front surface of the device incorporating the lower mirror, the prescribed material having a high etch selectivity for releasing the membrane 27 in a suspended and spaced relationship with respect to the lower mirror 23. In the present arrangement, the prescribed material for the sacrificial layer is zinc sulphide.

The process next involves forming the membrane 27 on the sacrificial layer using a deposition technique characterised by providing the required intrinsic stress in the membrane. The deposition technique employed is PECVD and the membrane is formed of silicon nitride. The second reflector layer 25 is then deposited on the membrane 27, patterned in accordance with a prescribed membrane geometry, and anisotropically etched to form the upper moveable mirror and shape the membrane according to the membrane geometry. The anisotropic etching process is a dry plasma etching process involving reactive ion etching.

The process then involves initially wet etching the sacrificial layer in an HCl dip to isotropically remove regions of the sacrificial layer down to the first reflector layer 23 on the detector 15, exposing the same, but which is timed so that there is no substantial undercutting of the zinc sulphide beneath the membrane or of the membrane support covered by the membrane. Those regions of the sacrificial layer intended to function as the residual support structure 29 of the membrane are then protected by a photoresist, whereupon the remaining unprotected regions of the sacrificial layer are finally etched using an isotropic etching process and the protection removed from the support structures 29 to suspend the membrane 27 in substantially parallel relation to the first reflector layer 23.

The force plate electrodes 30 are actually applied to the detector 15 before the membrane is formed to respective sides of the n-p junction 19 to allow for electrical connection to the detector device 11.

Although the above detector device 11 is formed with a horizontal n-p photodiode detector for IR wavelengths, in practice there are a number of different detector types suiting particular applications to which the invention is applied that affect the ultimate configuration of the tunable cavity resonator. These different detector types are shown formed with their corresponding substrate as applicable, in FIGS. 2A to 2E.

Figure 2A:
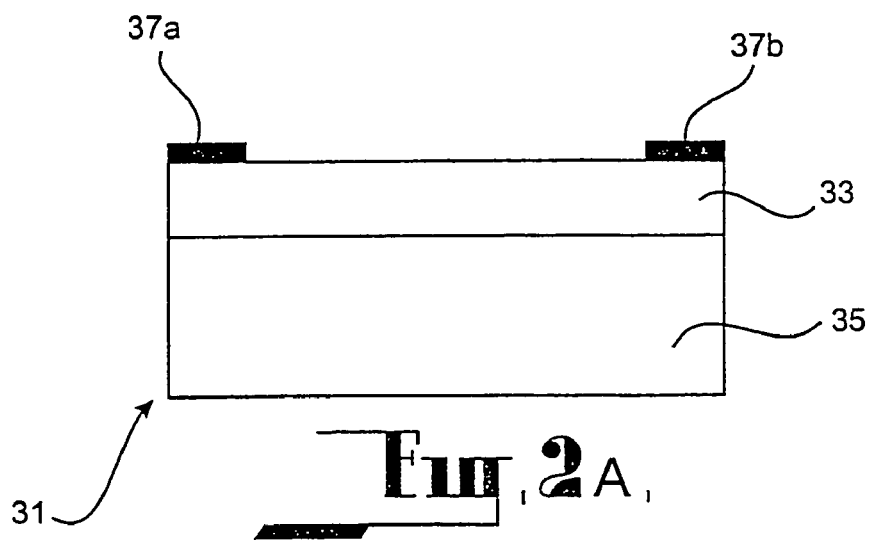
FIG. 2A is a cross-sectional schematic diagram of a photoconductor detector type.

As shown in FIG. 2A, the detector type is a photoconductor 31, which simply comprises a layer of IR sensitive material 33 such as MCT grown on a substrate 35, where contacts 37a and 37b are disposed at spaced apart locations on the IR sensitive material layer.

Figure 2B:
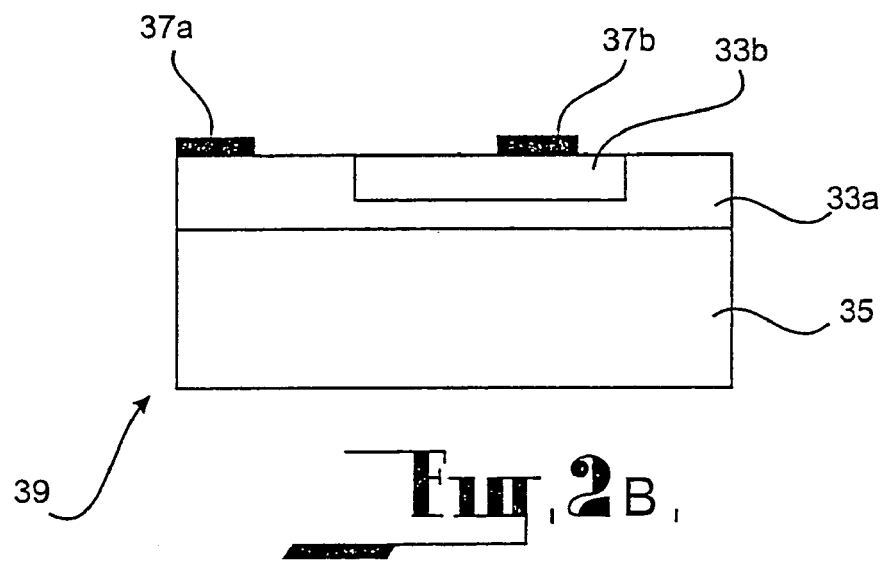
FIG. 2B is a cross-sectional schematic diagram of one arrangement of a horizontal junction photodiode or avalanche photodiode detector type.
Figure 2C:
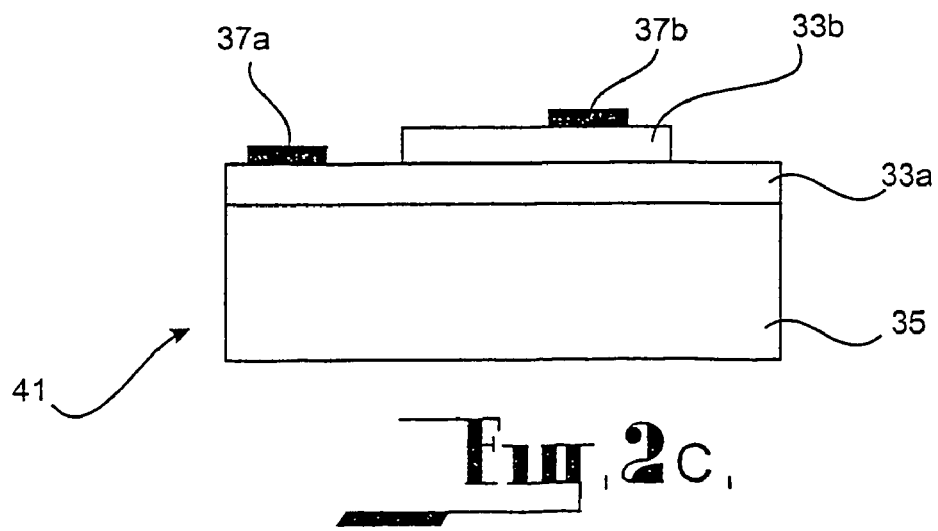
FIG. 2C is a cross-sectional schematic diagram of another arrangement of a horizontal junction photodiode or avalanche photodiode detector type, where diodes have been mesa isolated.

In FIGS. 2B and 2C, alternative arrangements of horizontal junction photodiodes or avalanche photodiodes are shown, where the IR sensitive material layer 33 comprises a predominantly horizontal n-p or p-n junction.

In the case of FIG. 2B, the horizontal junction photodiode 39 has an n (or p) portion 33b type converted within a p-type (or n) layer 33a to form the IR sensitive device 39, with contacts 37a and 37b respectively mounted upon the layer 33a and the portion 33b.

In the case of FIG. 2C, the horizontal junction photodiode 41 has a p-type (or n) layer 33a grown on the substrate 35, followed by an n-type (or p) layer 33b grown on the preceding layer 33a, whereby the layer 33b is etched to reveal part of the surface of the layer 33a for disposing a contact 37a with the other contact 37b disposed on the layer 33b.

Figure 2D:
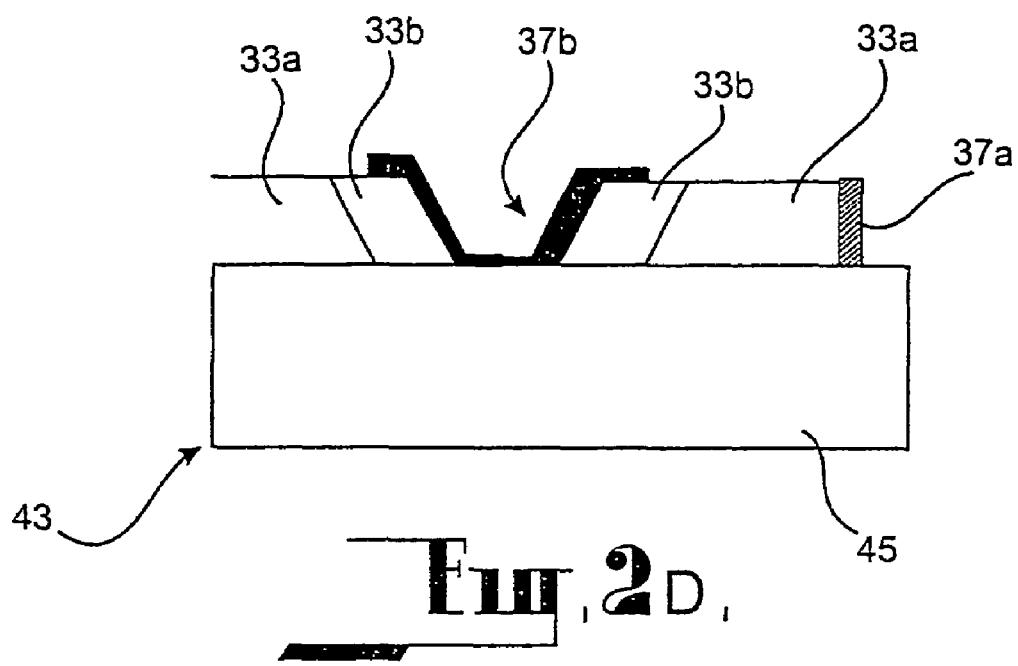
FIG. 2D is a cross-sectional schematic diagram of one arrangement of a vertical junction photodiode or avalanche photodiode detector type.
Figure 2E:
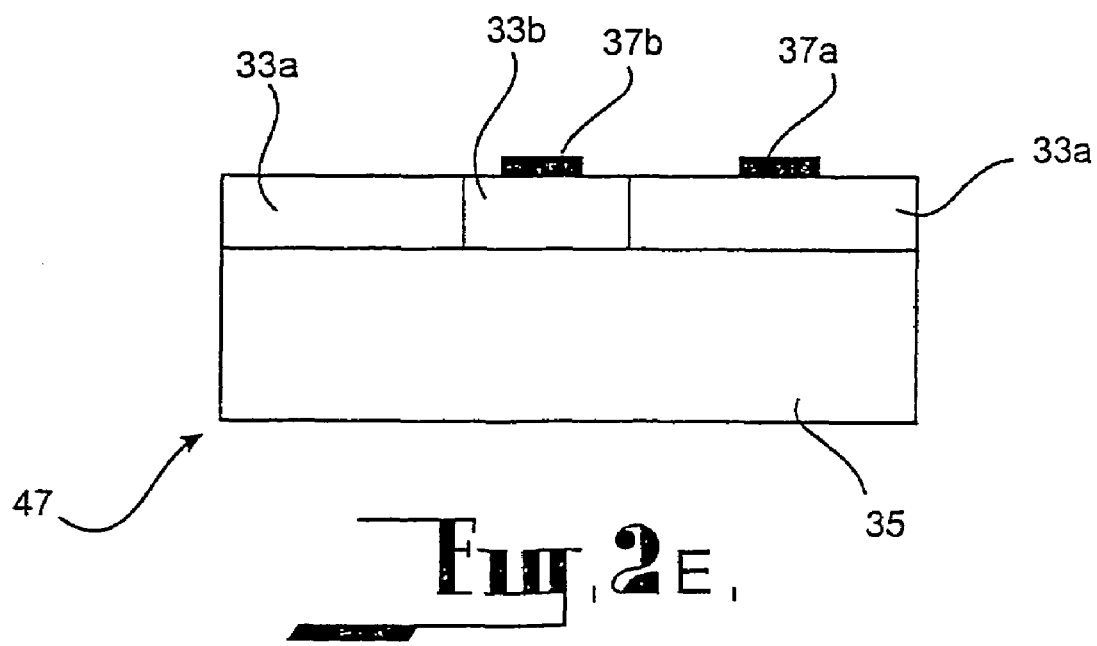
FIG. 2E is a cross-sectional schematic diagram of another arrangement of a vertical junction photodiode or avalanche photodiode detector type.

In FIGS. 2D and 2E, alternative arrangements of vertical junction photodiodes or avalanche photodiodes are shown, where the IR sensitive material layer 33 comprises a predominantly vertical n-p or p-n junction.

In the case of FIG. 2D, the vertical junction photodiode 43 has a p-type (or n) layer 33a directly adhered to the read out integrated circuit (ROIC) electronics 45 and an n-type (or p) layer 33b type converted within a portion of the layer 33a right through to the ROIC so that it also is directly adhered to the ROIC electronics 45, whilst forming a vertical junction with layer 33a. The contact 37a is vertically disposed on the end of the layer 33a, and the contact 37b surmounts the opposing ends of the interposed layer 33b to conjoin them.

In the case of FIG. 2E, the vertical junction photodiode 47 has a p-type (or n) layer 33a grown on the substrate 35, with an n-type (or p) layer 33b formed within a portion of the layer 33a right through to the substrate 35 so that it forms a vertical junction with the layer 33a. Contacts 37a and 37b are respectively disposed on the upper surface of the layers 33a and 33b.

Although the arrangement shown in FIG. 1 is a significant improvement on prior art detector devices, the cavity 13 is optically in front of the detector 13. As described in the specification of International Patent Application PCT/AU03/00280, and adopting alternative detector arrangements as shown in FIG. 2, various other detector device arrangements may be provided, with the device being either front or rear illuminated with respect to the substrate or readout electronics, however, all of these devices have the detector disposed externally of the cavity. When the detector is external of the cavity, the cavity filters the incident radiation and only certain wavelengths will be permitted to pass through to the detector.

According to the present invention, however, the detector is disposed within the cavity, and thus for those wavelengths that are in tune with the cavity, these will resonate within the cavity and thus pass through the detector multiple times. This means that the detector can be thinner and still absorb the same amount of photons. Hence the thickness of the detector can be reduced, which in turn reduces certain noise mechanisms allowing the signal-to-noise ratio of the device to be improved, and permit the detector to be operated at higher temperatures.

Adopting a device having a detector that is internally disposed within the cavity requires an alternative device design that can be achieved a number of different ways.

Figure 3:
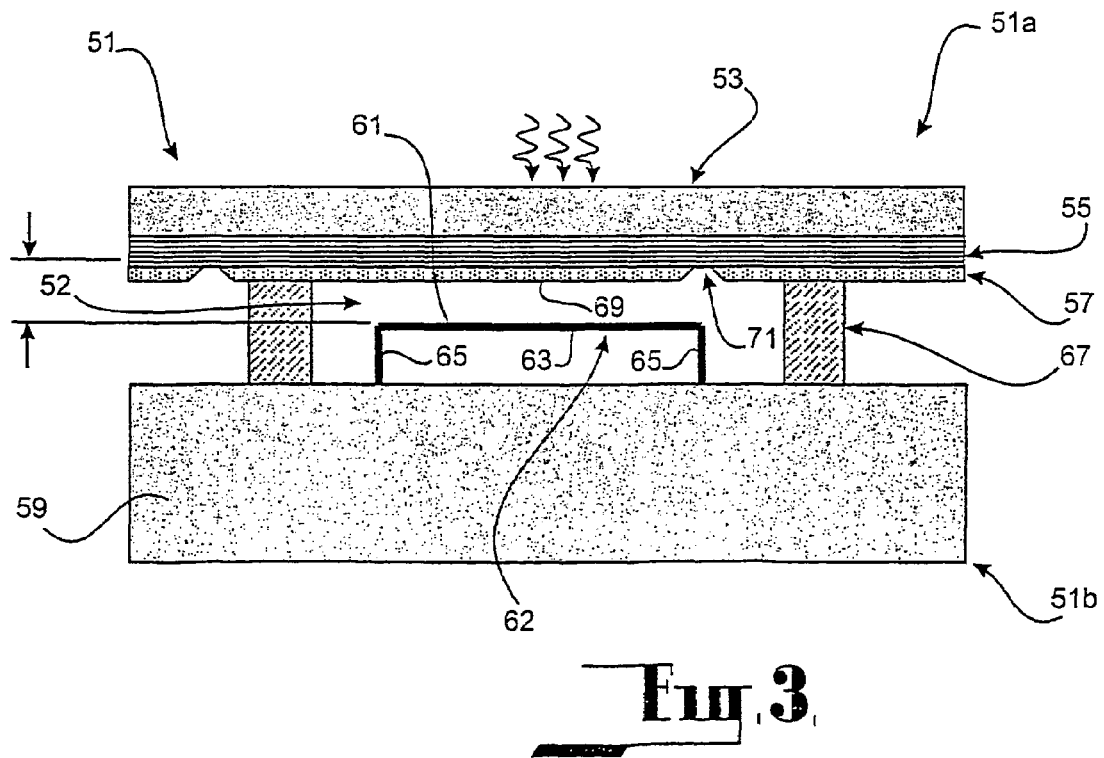
FIG. 3 is a schematic cross-sectional view of a composite detector device according to a first embodiment.

The first embodiment of the invention is directed towards a rear or back-side illuminated detector device 51 as shown in FIG. 3 of the drawings. In this arrangement, the detector device 51 is formed in two parts, which are then conjoined to form an integral detector device with the detector disposed therein.

The first part 51a of the detector device involves forming one side of a Fabry-Perot cavity 52, comprising a substrate 53 of IR radiation transparent material having a first reflector layer 55 epitaxially grown thereon as a wide bandgap MCT/CT (HgCdTe/CdTe) $\lambda/4$ dielectric stack to form a back mirror. An active detector layer 57 in the form of MCT is then grown on the first reflector layer 55 to complete the construction of the first part of the device. The surface of the detector layer for receiving incident radiation is provided with an anti-reflection (AR) coating to prevent Fresnel reflections therefrom that may otherwise form a complicated coupled multi-cavity structure. It should be appreciated, however, that detailed optical design of the structure is required since unrealistically thick layers for the AR coating may result. Alternatively the detector can be embedded into the mirror structure The second part 51b of the detector device involves forming the other side of the Fabry-Perot cavity comprising a readout substrate 59 of silicon having a second reflector layer 61 formed as a MEMS structure 62 thereon. The MEMS structure 62 is formed as before using the etched sacrificial layer, resulting in a geometrically shaped membrane 63 suspended by a support structure 65 mounted on the readout substrate, with the second reflector layer 61 disposed on the membrane. Appropriate spacing means in the form of indium bumps 67 are mounted upon the readout structure, having a height greater than the height of the support structure 65 by an amount commensurate to the maximum cavity length of the Fabry-Perot cavity that is provided in the completed device, less the thickness of the detector layer 57.

After completing the formation of both parts 51a and 51b of the detector device, the respective sides of the device are conjoined relative to each other so that the first part 51a surmounts the supporting means of the second part 51b, with the reflectors 55 and 61 disposed in confronting relationship with each other, spaced apart a cavity length, with the active detector layer 57 disposed therebetween sitting on the distal ends of the indium bumps 67. The conjoining of the two parts is undertaken using a flip-chip bonding process, whereby the engaging portions of the detector layer 57 and the ROIC 59 are adhered via indium bumps 67.

In normal practice, an array of detector devices 51 are formed in the one flip-chip bonding procedure. Thus the first part 51a of the device has its active detector layer etched to form a reticule providing a regular matrix of detector cells 69 arranged in a grid formation separated by rectilinear gaps or spaces 71 etched down to the first reflector layer 55. The second part 51b of the device similarly has the indium bumps 67 arranged in the form of a regular rectangular matrix circumscribing discrete cells each of which contain a MEMS structure 62 as described above. The cells of each part are of corresponding size, and are precisely aligned with the distal ends of the indium bumps engaging the outer surface of the engaging portion of the detector layer, immediately adjacent to each of the gaps 71 as shown in FIG. 3 of the drawings. In this manner, the reflector and substrate layers are common to each of the cells, to optimise electrode connection for controlling the displacement between the reflector layers as well as to the detectors themselves.

In this particular arrangement, it should be appreciated that the MEMS structure 62 operates in a manner whereby the movement of the membrane can be both:

(i) outwardly of the distal ends of the supporting structure 65 and the inner side of the readout substrate 59, towards the detector layer 57 and the first reflector layer 55 for the purposes of tuning the cavity to a resonant wavelength that is less than that provided when the membrane 63 is at its rest position with minimal intrinsic stress as shown in FIG. 3, and (ii) inwardly of the distal ends of the supporting structure 65 and the inner side of the readout substrate 59, away from the detector layer 57 and the first reflector layer 55 for the purposes of tuning the cavity to a resonant wavelength that is greater than that provided when the membrane 63 is at its rest position with minimal intrinsic stress as shown in FIG. 3.

In the case of (i), force plates (not shown) are provided on the membrane 63 and the detector layer 69 so that a tuning voltage may be applied across the second reflector layer 61 and the detector layer 69 to electrostatically attract them towards each other an amount proportional to the applied bias. Consequently, the membrane 63 would move towards the detector layer 69 as the voltage is increased.

In the case of (ii) force plates (not shown) are provided on the top of the readout substrate 59 and the membrane 63 so that a tuning voltage may be applied across the readout substrate 59 and the second reflector layer 61 to electrostatically attract them towards each other an amount proportional to the applied bias. Consequently, the membrane 63 would move towards the readout substrate 59 as the voltage is increased.

Figure 4:
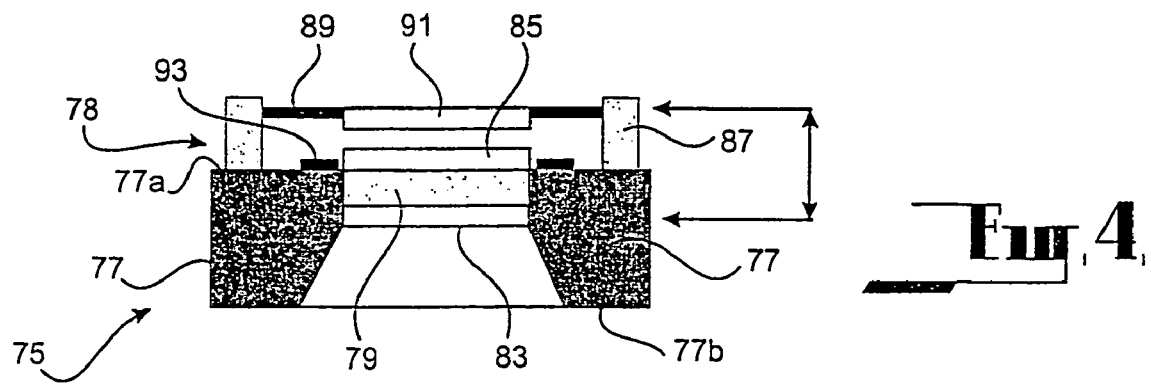
FIG. 4 is a schematic cross-sectional view of a detector device according to a second embodiment.

The second embodiment is directed towards a front-side illuminated detector device 75 comprising a resonant cavity structure in which the detector is located inside the cavity and within the substrate of the cavity, as shown in FIG. 4 of the drawings. In this arrangement the detector device 75 is fabricated as a single device from a substrate 77 on which a MEMS structure 78 is formed and the detector integrally disposed.

In this embodiment, the substrate 77 has the active detector 79 initially embedded therein on the front side 77a of the substrate to form part of the inside of a Fabry-Perot cavity. A window 81 is then etched in the rear side 77b of the substrate to reveal the rear of the embedded detector 79. A first reflector layer 83 is then deposited on the rear of the active detector to form the one reflector of the cavity resonator. An anti-reflection (AR) coating 85 is then provided on the front surface of the detector 79 to prevent Fresnel reflections from the front surface forming a complicated coupled multi-cavity structure. As in the first embodiment, detailed optical design techniques are employed to ensure that the AR coating 85 is not unrealistically thick. Alternatively, the detector could be part of the mirror structure and therefore the AR coating would not be of concern.

The MEMS structure 78 is then formed on the front side 77a of the substrate, in a similar manner to the MEMS structure described in relation to FIG. 1, using a sacrificial etched layer. In this manner, the structure as shown in FIG. 4 is fabricated comprising a support structure 87 suspending a membrane 89 with a second reflector layer 91 disposed thereon in substantially parallel relationship to the substrate 77 to form the other reflector of the cavity resonator.

The electrodes 93 for connecting to the detector are similar to the arrangement shown in FIG. 1 of the drawings, being in the form of force plate electrodes disposed on the front surface 77a of the substrate.

The first reflector layer 83 constitutes the back mirror of the device and the second reflector layer 91 constitutes an upper moveable mirror of the device, the mirrors defining the resonant cavity therebetween. Accordingly, the cavity extends into the substrate 77 with the active detector layer 79 disposed within the cavity.

The third embodiment is directed towards a front-side illuminated detector device similar to the second embodiment but utilising aspects of the first embodiment to eliminate the need of a substrate altogether.

Figure 5:
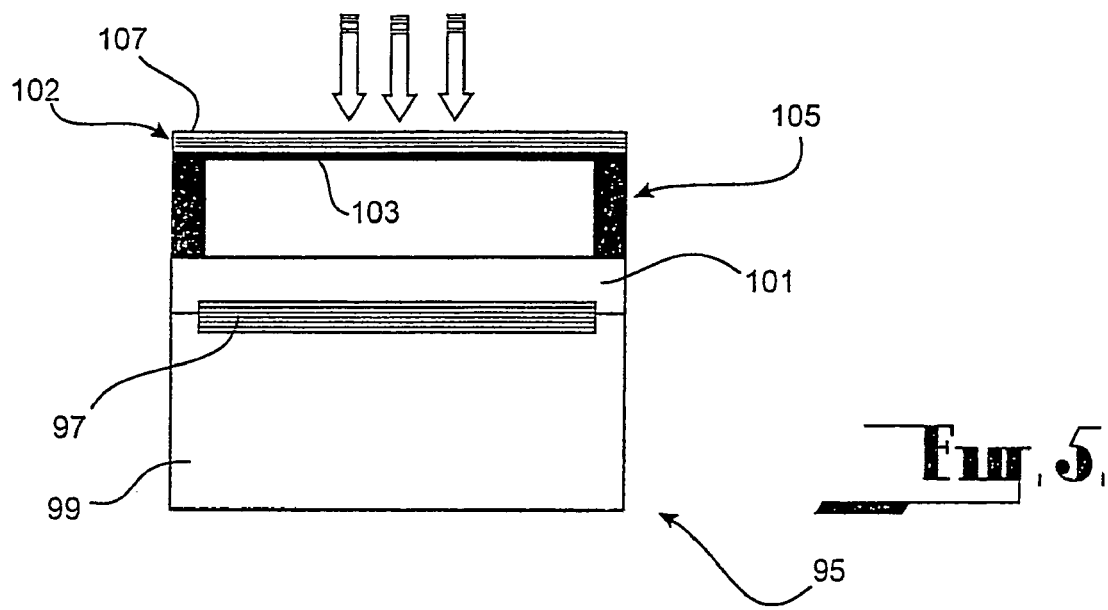
FIG. 5 is schematic cross-sectional view of a detector device according to a third embodiment.

As shown in FIG. 5 of the drawings, the detector device 95 of this embodiment comprises one reflector being fixed formed by a first reflector layer 97 directly formed onto a silicon readout layer 99 being the readout electronics integrated circuit (ROIC) for the device. An active detector 101 is then formed upon the first reflector layer 97, interposing the first reflector layer as the back mirror of the device between the ROIC 99 and the detector 101. A MEMS structure 102 is then formed on the detector 101, using the same process described in relation to FIG. 1 resulting in a membrane 103 being suspended upon a support structure 105 and having a second reflector layer 107 formed on the membrane to constitute the upper moveable mirror of the device.

Figure 6:
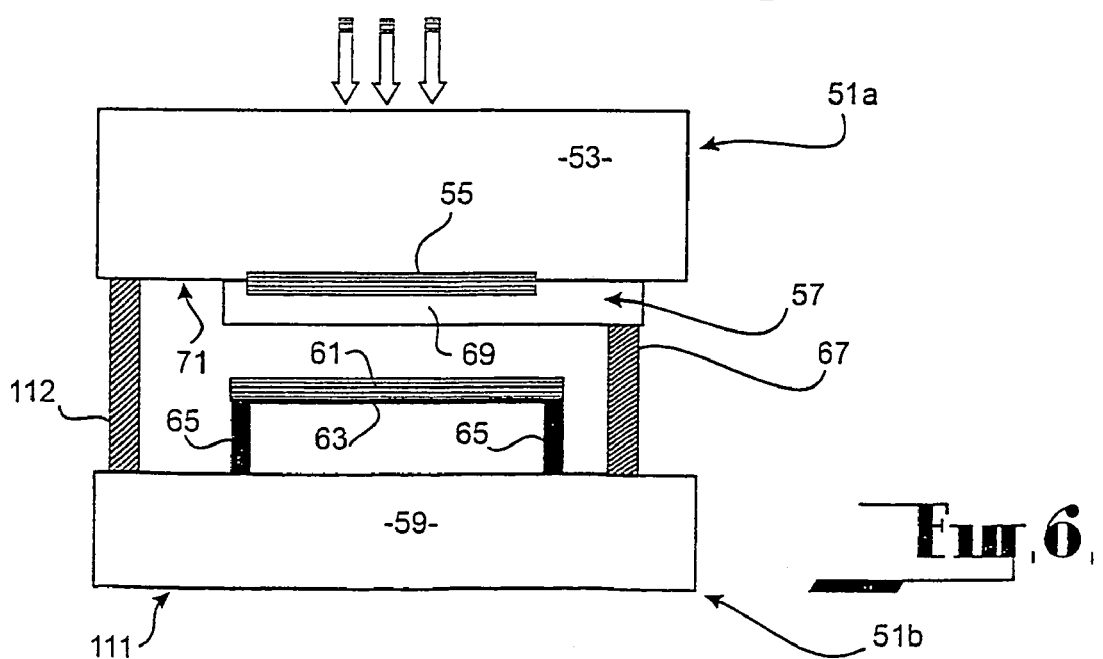
FIG. 6 is a minor variation of the first embodiment.

A minor variation to the detector device of the first embodiment is shown in FIG. 6, where the same reference numerals have been used to identify corresponding items described in relation to the first embodiment. In this variation, the detector device 111 has the gap 71 provided by the termination of the active detector layer 69 within the cell wide enough for a spacer 112 to be aligned therewith as opposed to an indium bump 67, so that the distal end of the spacer 112 engages the substrate directly, whilst the distal end of the indium bump 67 engages the detector 57 as before. In this arrangement, the spacer 112 ends up determining the cavity length with precision greater than that which can be achieved using indium bumps per se. However, the indium bump 67 is retained to make up part of the electrical connection of the IR sensing circuit between the ROIC 59, the substrate 53 and the detector 57 to facilitate the connection arrangement.

Although the drawing shows a detector device with a single MEMS structure, in practice the detector device would be formed with an array of such MEMS structures, separated by alternate spacer 112 and indium bump 67 members.

In addition, force plates (not shown) may be disposed in alternative configurations on the membrane 63 and the detector layer 69, and/or on the readout substrate 59 and the membrane 63, to allow for controlled movement of the membrane 63 outwardly of the distal ends of the support structure 65 of the MEMS structure or inwardly thereof, respectively, as in the case of the detector device of the first embodiment.

A minor variation to the detector device of the second embodiment is shown in FIG. 7, where again the same reference numerals have been used to identify corresponding items described in relation to the second embodiment. In this variation, detector device 113 has the substrate 77 without the detector layer embedded therein and a rear etched window on the rear side thereof. Alternatively, the first reflector layer 83 and the detector 79 are built up as sequential layers on the front surface 77a of the substrate, and the MEMS structure 78 is formed on the outer surface of the detector layer 79. In this arrangement, the detector device 113 can receive IR radiation 115 from either the front side, incident to the upper moving mirror 91, or IR radiation 117 from the rear side, incident to the substrate 77.

The fourth embodiment is directed towards a front or backside illuminated detector device, which is derived from the first embodiment, but where the cavity is formed in a recessed portion of IR material incorporating the detector.

As shown in FIG. 8 of the drawings, the detector device 121 again is formed in two parts a first part 121a and a second part 121b, which are then conjoined to form the integral detector device shown.

The second part 121b of the detector device is fabricated by forming a complete MEMS structure 123 directly upon a substrate 125, according to any of the methods previously described. Importantly, the substrate 125 can be formed of any suitable type of IR transparent semiconductor material such as silicon or gallium arsenide (GaAs), which may not necessarily be as temperature sensitive as other semiconductor materials such as MCT. In this manner, the membrane fabrication process may be facilitated at higher temperatures to ensure membrane morphology and integrity.

The resultant MEMS structure is thus formed with a reflector mirror 127a deposited on the outer surface of the membrane 129, which is suspended in spaced relation with the substrate 125 by the support structure 131. The reflector mirror 127a and membrane 129 in this manner form one part of the FP cavity.

The first part 121a of the detector device is fabricated by depositing a reflector mirror 127b on one side of a layer of IR sensitive material 133 that can function as an IR detector and etching the other side of the layer to form a recess 135. The recess 135 is formed so as to leave a band of IR sensitive material between the bottom of the recess and the reflector mirror 127b, so that the band of IR sensitive material functions as the actual IR detector 137 for the device. Thus the reflector mirror 127b, the IR detector 137 and the recess 135 forms the other part of the FP cavity.

The two parts 121a and 121b are then brought into confronting relationship with each other so that the mirror 127a of the second part 121b is juxtaposed with the recessed side of the layer of IR sensitive material 133, the MEMS structure 123 essentially surmounting the top of the recess 135 to form an air gap between the bottom of the recess 135 and the mirror 127a. The two parts are bonded either by van der Waal's forces or by applying an epoxy adhesive between the confronting surfaces to create an integrated detector device 121.

Thus a complete FP cavity is formed between the mirrors 127, with the IR detector 137 disposed within the cavity to form a resonant cavity enhanced device. The mirrors 127 may either form the electrodes of the device, or separate force plate electrodes may be provided for controlling flexure of the membrane 129 by the application of an electrical potential between the electrodes and a resultant electrostatic force applied to the suspended membrane and mirror structure. This electrostatic force is then controlled by the applied bias to move the suspended membrane and mirror structure into the cavity 135 a controlled amount to allow for tuning of the FP cavity.

The fourth embodiment can be easily extended to provide another arrangement where the reflector mirror 127b is formed directly onto an ROIC, similar to the arrangement shown in FIG. 5 of the drawings.

Further still, in such an arrangement, a force plate electrode may be disposed on the substrate 125 to allow for controlled movement of the membrane 129 outwardly of the distal ends of the support structure 131 of the MEMS structure (by applying a voltage bias across the force plate electrode and the mirror 127a) or inwardly thereof (by applying a voltage bias across the two mirrors 127), as in the case of the detector device of the first and third embodiments.

The fifth embodiment is directed towards an extension of the arrangement shown in FIG. 7 of the drawings to provide for a multi-spectral detector device.

Figure 9:
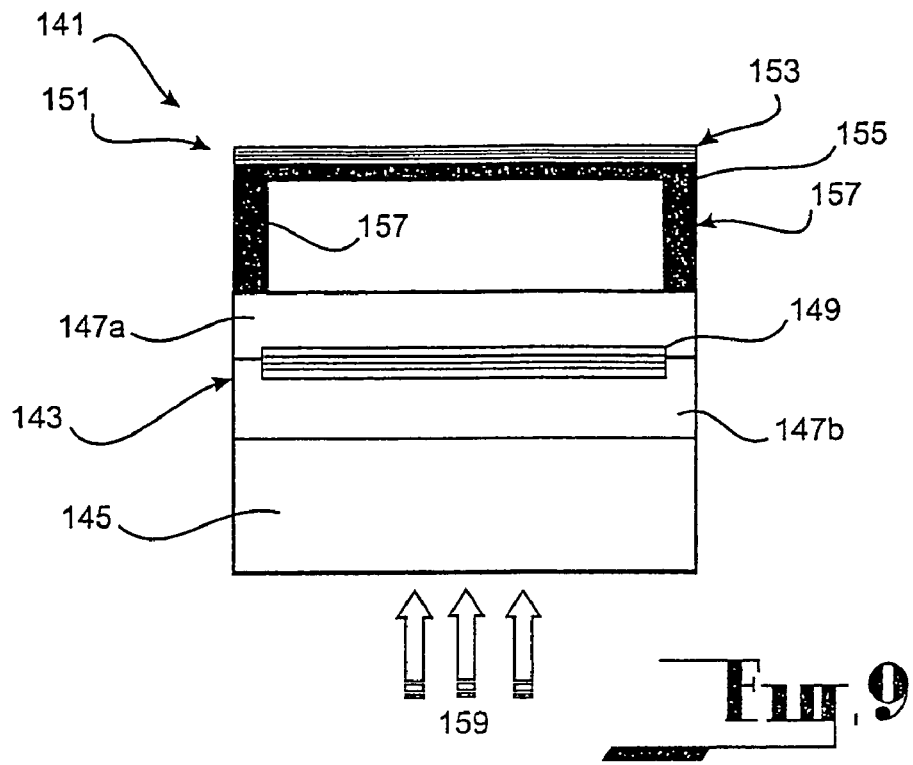
FIG. 9 is a schematic cross-sectional view of a detector device according to a fifth embodiment.

As shown in FIG. 9 of the drawings, the detector device 141 essentially comprises a composite detector 143 formed with two active detector layers of IR sensitive material, that are grown upon a substrate 145 that is transparent to IR radiation. One of the layers 147a is sensitive to incident radiation at a range of wavelengths that is different to the sensitivity of the further layer 147b. Importantly, the two detector layers 147a and 147b are separated by a first reflector layer 149 interposed therebetween. The first reflector layer 149 forms the one fixed reflector of the resonant cavity, which is completed by the fabrication of a MEMS structure 151 upon the composite detector 143.

The MEMS structure 151 is formed with a second reflector layer 153 deposited on the outer surface of a membrane 155, which is suspended in spaced relation to the composite detector 143 by a support structure 157, as described in relation to FIGS. 5 and 7 of the preceding embodiments.

In this particular embodiment, the device is "back side" illuminated where incident IR radiation impinges the back or underside of the substrate 145 and radiates therethrough to the detector and cavity for detection purposes.

As previously described, the detector device 141 is constructed sequentially from the substrate 145 in the order of the further detector layer 147b, the first reflector layer 149, the one detector layer 147a, and the MEMS structure 151 thereon.

Importantly, for the purposes of the present embodiment, the one detector layer 147a is disposed within the FP cavity formed between the two reflectors 147a and 147b, and the further detector layer 147b is disposed outside of the cavity. Furthermore, the one detector layer 147a is sensitive to a longer range of wavelengths, for example LWIR, than the further detector layer 147b, which, for example may be sensitive to MWIR.

In this manner, a multi-spectral detector is provided within the one device, whereby the top part of the device incorporating the longer wavelength detector 147a is tunable to detect a specific wavelength of incident IR radiation, whereas the lower part of the device incorporating the shorter wavelength detector 147b is fixed and thus would function as a broadband detector.

It should be appreciated that this arrangement can also be configured in a manner similar to FIG. 6 of the drawings, where the composite detector with the substrate base layer comprises one part of the device and is bumped bonded using Indium bumps to the second part of the device comprising a further base layer in the form of a readout integrated circuit with the MEMS structure fabricated thereon. The advantage of this form of construction is that the MEMS structure can be fabricated on the readout integrated circuit separately of the first part of the device comprising the temperature sensitive detectors, using conventional plasma deposition techniques, and both parts can be subsequently integrated to form the complete device without damaging the detectors.

The sixth embodiment is also directed towards a multi-spectral detector device, but this time incorporating two tunable FP cavities within the one device.

Figure 10:
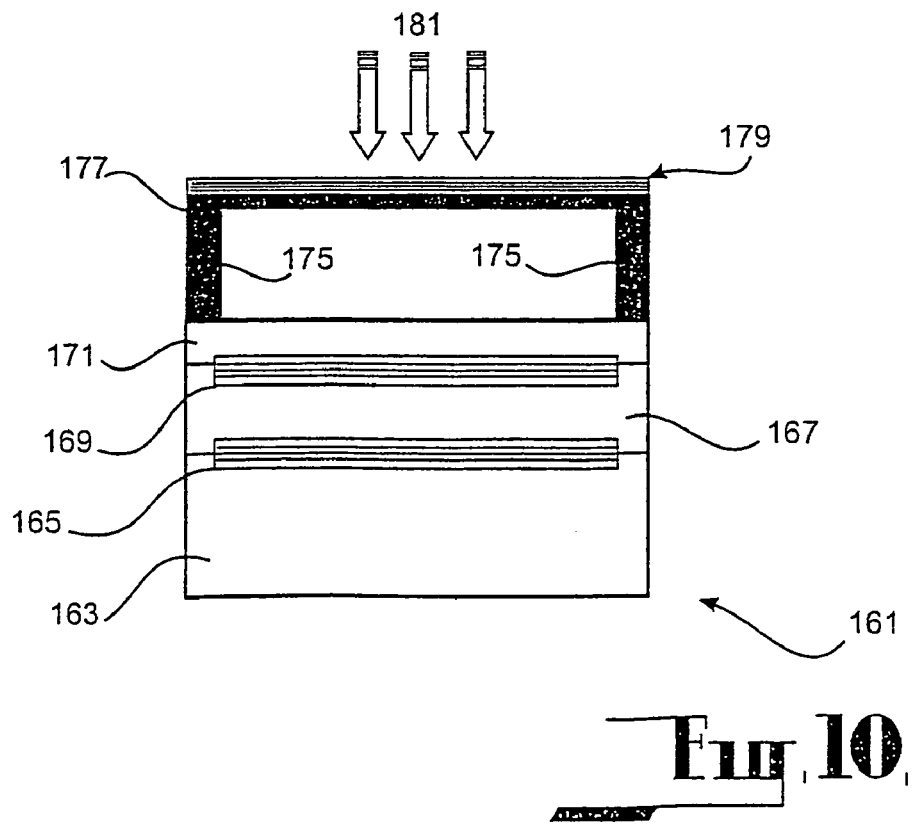
FIG. 10 is a schematic cross-sectional view of a detector device according to a sixth embodiment.
Figure 11:
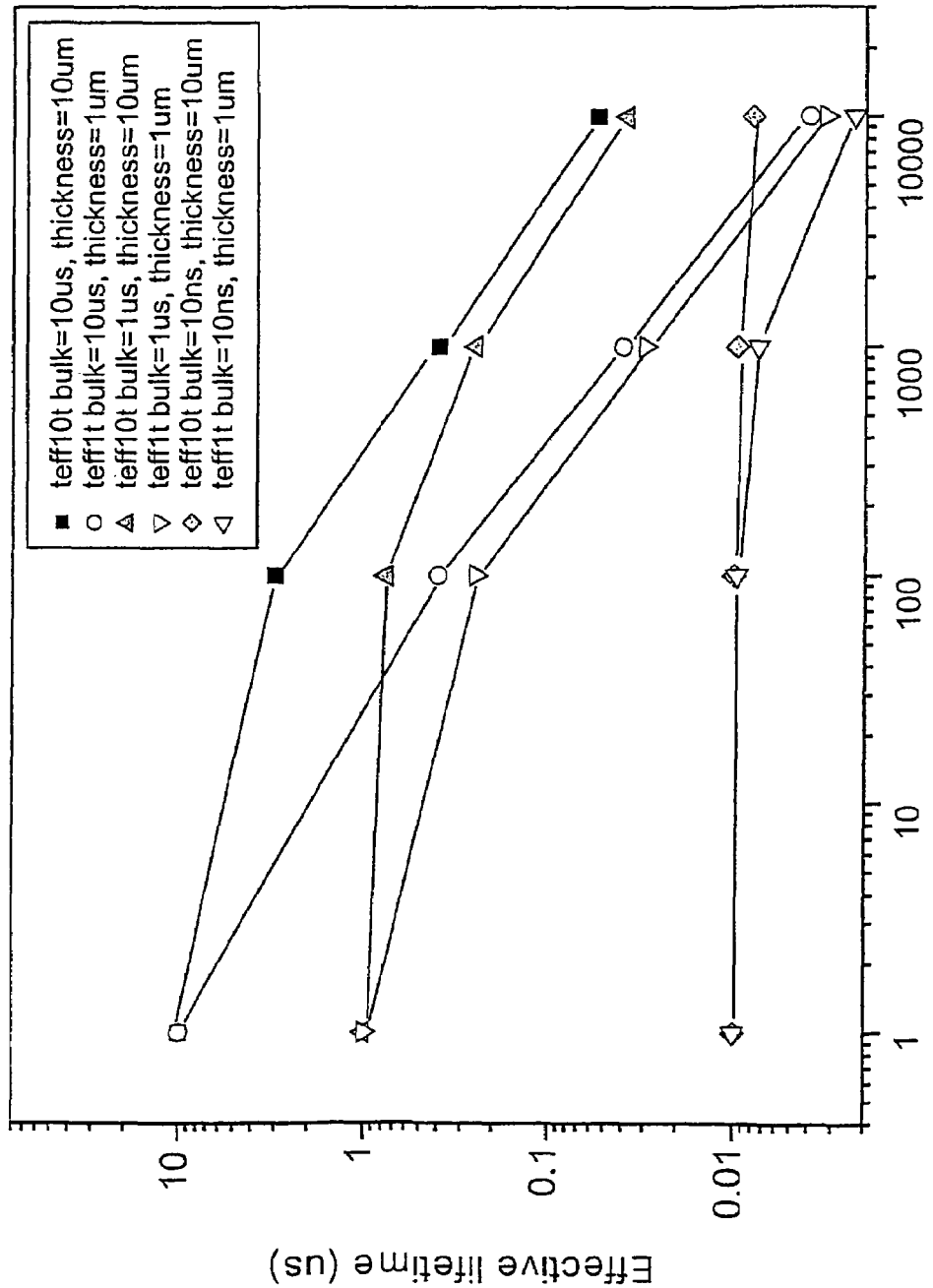
FIG. 11 is a graph of the effective minority carrier lifetime, as calculated, versus surface recombination velocity as a function of bulk lifetime and active layer thickness.

As shown in FIG. 10 of the drawings, this detector device is similar to that of the previous embodiment except that essentially a further reflector layer is interposed between the base layer and the further detector layer, and the ranges of IR radiation sensitivity of the two layers is reversed.

Moreover, the detector device 161 comprises a base layer 163 that may be either be formed of a substrate semiconductor material, or a readout integrated circuit. From this base layer 163, the device is sequentially fabricated, firstly growing or depositing the further reflector layer 165 on the base layer 163, then growing the further detector layer 167 so that the further reflector layer is embedded between the further detector layer 167 and the base layer 163. Next the first reflector layer 169 is grown on the further detector layer 167, and the first detector layer 171 is then grown so that the first reflector layer 169 is embedded between the first detector layer 171 and the further detector layer 167 to complete the construction of a first part of the device comprising a plurality of detectors and fixed reflectors.

Thereafter, the MEMS structure 173 is fabricated on the first part of the device, whereby a support structure 175 suspends a flexible membrane 177 and a moveable second reflector layer 179 above the first detector layer 171.

In this particular embodiment, two FP cavities are formed in the one device. The first cavity is defined between the moveable second reflector layer 179 and the fixed first reflector layer 169, wherein the first detector layer 171 is disposed within the cavity. The second cavity is defined between the moveable second reflector layer and the fixed further reflector layer 165, wherein the further detector layer 169 is disposed within this cavity.

This device is illuminated from the front or top side as shown in the drawings, with incident IR radiation 181 impinging the second reflector and passing through the cavities with resonant wavelength IR of the respective cavities being absorbed within the respective detectors and the remaining wavelength IR radiation passing through the device.

As a result of this type of illumination, the first detector comprises an IR sensitive layer sensitive to a range of wavelengths that are shorter (eg SWIR) than the further detector layer (which may be sensitive to MWIR).

As opposed to the previous embodiment, both cavities are simultaneously tunable conjunctively to discrete specific wavelengths of IR radiation by moving the second reflector layer 179 of the MEMS structure. It should be appreciated, however, that the cavities are not individually tunable, and the resonant wavelengths for both cavities will shift a prescribed amount on adjusting the position of the second reflector layer.

It should also be appreciated that like the previous embodiment, the multi-spectral device of the present embodiment can be constructed in two discrete parts using the bump bonded conjoined structure described with reference to FIG. 6.

Now having described the various embodiments of the detector devices, the broad areas where it is envisaged the detector devices having resonant cavity enhancement may be used to solve existing technological issues will be discussed in detail. These areas may be summarised as follows:

(i) High performance infrared detectors functioning at high operating temperatures (HOT).
(ii) High performance very long wavelength infrared detectors for low background applications.
(iii) Wavelength agile detectors.

HOT Detectors

The first application of resonant cavity enhanced devices (RCE) is in the area of photodetectors for use under reduced cooling conditions, or high operating temperature (HOT) detectors. At high operating temperatures IR photon detectors are normally operating in the regime where noise is dominated by carrier diffusion rather than generation-recombination (g-r) or tunnelling, and thus any reduction in detector volume, by reducing layer thickness, will result in a decrease in thermally generated dark currents and thus improved signal to noise ratio. Most MWIR detectors are diffusion limited at higher temperatures (200° K.) and g-r limited at 80° K. For diffusion limited detectors, reduction in the thickness of the absorbing layer may have a detrimental effect on device performance if the semiconductor/substrate interface and/or the semiconductor passivant interface are regions of enhanced recombination (in comparison to the bulk). This will cause a decrease in the effective lifetime of the bulk HgCdTe and thus a concomitant decrease in detector performance. Typical degradation of minority carrier lifetime as a function of bulk lifetime, layer thickness, and interface recombination are shown in FIG. 8. These simulation results are obtained from an in-house semiconductor simulation package. This figure indicates that increasing levels of surface recombination will have a greater effect on effective lifetime for thin devices and longer bulk lifetimes.

The resonant cavity enhanced devices described above provide a method for reducing this loss, by using a thin layer of absorbing HgCdTe sandwiched between two graded layers of higher bandgap material with high quality heterointerfaces. Such a structure will inhibit the flow of photogenerated minority carriers to regions of high recombination velocity at the semiconductor/passivant interface or the semiconductor/substrate interface.

Graded heterostructure interfaces are known to have lower surface recombination velocities than external semiconductor interfaces, and can be readily grown via MBE.

VLWIR Detectors

The second application of RCE devices is aimed at improving the performance of VLWIR devices, which are diffusion limited even at low temperatures. Once again, providing that the detectors are operating in the diffusion limited regime, a reduction of material volume will improve performance, assuming that interface quality can be maintained at a high level. The reduction in thermally generated noise with the use of reduced volume structures operating at low temperatures, enables the use of HgCdTe for fabrication of high performance VLWIR devices for low background applications.

Wavelength Agile Detectors

By allowing one of the cavity mirrors to be movable, the detector designs developed for the applications outlined above can be modified to allow their use in applications requiring wavelength agile, or tunable detectors. Tuning of wavelengths in the long wavelength and mid wavelength infrared region requires large changes in cavity length and hence large movements in the membrane supporting the mirror.

It should be appreciated that the scope of the present invention is not limited to the specific embodiments herein described. In particular, the invention is not limited to the fabrication of detector devices using the specific processes described herein. Accordingly, similarly configured resonant cavity enhanced detector devices, but which are fabricated according to different processes are nonetheless deemed to fall within the scope of the present invention.

In addition, the invention is not limited to the specific types of detectors and detector devices described herein. In this respect, there are several different types of detectors in existence and future arrangements still to be developed that still may be improved by adopting cavity enhancement. Accordingly, it is understood that appropriate modifications and variations to the methods described herein that are necessary to adapt the invention to other detector types, but which are obvious or common knowledge to a person skilled in the art of semiconductor fabrication, are considered to be part of the invention and fall within the scope thereof.

The invention claimed is:

1. A detector device for detecting incident radiation at particular wavelengths, comprising:
   a base layer of material;
   a cavity formed on the base layer, the cavity having a pair of reflectors, one being a first reflector layer disposed in fixed relationship with respect to the base layer and the other being a second reflector layer disposed in opposed spaced relationship to the first reflector layer to form a resonant cavity between the reflector layers, the reflectors being disposed a cavity length from each other; and
   a detector disposed within the cavity to absorb incident radiation therein for detection purposes,
   wherein the detector is further disposed towards one end of the cavity and on one of the first or second reflector layers,
   the second reflector layer is formed on a movable membrane disposed in spaced relationship to the base layer, and
   the detector device further comprises a pair of electrodes to control the movement of the membrane.

2. A detector device as claimed in claim 1, wherein the first reflector layer and the second reflector layer are disposed in substantially parallel spaced relationship to each other.

3. A detector device as claimed in claim 1, wherein the second reflector layer is formed so that at least a portion of it is of slightly concave form with respect to the interior of the cavity.

4. A detector device as claimed in claim 1, wherein the surface of the detector for receiving incident radiation is provided with an anti-reflection (AR) coating to prevent Fresnel reflections therefrom that may otherwise form a complicated coupled multi-cavity structure.

5. A detector device as claimed in claim 1, wherein the detector is formed as an integral part of the reflector structure.

6. A detector device as claimed in claim 1, wherein the base layer comprises an integrated circuit.

7. A detector device as claimed in claim 1, wherein the cavity length corresponds to optical wavelengths in the infrared region.

8. A detector device as claimed in claim 1, wherein the detector is an active detector layer disposed in juxtaposition with the first reflector layer.

9. A detector device as claimed in claim 1, wherein the base layer is a substrate.

10. A detector device as claimed in claim 9, wherein the substrate material is a semiconductor or semiconductor system that is transparent to radiation in the wavelengths to be detected by the detector device.

11. A detector device as claimed in claim 1, wherein the base layer is formed from an infrared sensitive material.

12. A detector device as claimed in claim 11, wherein the infrared sensitive material is mercury cadmium telluride (MCT).

13. A detector device as claimed in claim 1, wherein the electrodes are constituted by the reflectors.

14. A detector device as claimed in claim 1, wherein the electrodes are juxtaposed with the reflectors, one electrode with the one reflector and the other electrode with the other reflector.

15. A detector device as claimed in claim 1, wherein the moveable membrane is suspended relative to the base layer at the periphery of the membrane by a support structure.

16. A detector device as claimed in claim 15, wherein the membrane is formed of silicon nitride.

17. A detector device as claimed in claim 15, wherein the displacement of the suspended moveable membrane can be up to the full length of the air gap provided in the cavity, but is adjusted to avoid the membrane contacting the reflector, the detector or a readout integrated circuit, depending upon the particular detector arrangement.

18. A detector device as claimed in claim 15, herein the membrane and one reflector are shaped in accordance with a prescribed membrane geometry.

19. A detector device as claimed in claim 15, wherein the first reflector layer and the detector are separate from the base layer, whereby the second reflector layer and the moveable membrane are interposed between the detector and the base layer.

20. A detector device as claimed in claim 19, wherein the detector forms part of a homogeneous layer of material having the first reflector juxtaposed on one side thereof, distal from the base layer, and the second reflector juxtaposed on the other side thereof, proximal to the base layer, whereby a recess is formed within the homogeneous layer of material adjacent to the second reflector layer to form an air gap within the cavity, and the detector is defined by the residual homogeneous layer of material disposed between the recess and the first reflector layer.

21. A detector device as claimed in claim 15, wherein the first reflector layer and the detector are integrated or integral with the base layer.

22. A detector device as claimed in claim 21, wherein the support structure is mounted upon the detector or the base layer of the device.

23. A detector device as claimed in claim 22, wherein the first reflector layer is disposed on the surface of the base layer and is embedded between the detector and the base layer.

24. A detector device as claimed in claim 21, wherein the support structure is mounted upon a further base layer disposed in opposing, spaced relationship to the detector by a support.

25. A detector device as claimed in claim 24, wherein the further base layer comprises a readout integrated circuit.

26. A detector device as claimed in claim 25, wherein the support comprises indium bumps that form part of the connection between the readout integrated circuit of the device and the detector.

27. A method for fabricating a detector device for detecting incident radiation at particular wavelengths, the method including:
   providing a base layer of material;
   forming one reflector in fixed relationship with respect to the base layer;
   forming another reflector in opposed spaced relation to the one reflector so as to form a resonant cavity between the pair of reflectors, the reflectors being disposed a cavity length from each other; and
   forming a detector to be disposed within the cavity for absorbing incident radiation therein for detection purposes,
   wherein the detector is formed towards one end of the cavity and on one of the or the other reflector,
   the other reflector is formed on a moveable membrane disposed in spaced relationship to the base layer, and
   the method further comprises forming a pair of electrodes to control the movement of the membrane.

28. A method as claimed in claim 27, including disposing the one reflector and the other reflector in substantially parallel spaced relationship to each other.

29. A method as claimed in claim 27, including forming the other reflector so that at least a portion of it is of slightly concave form with respect to the interior of the cavity.

30. A method as claimed in claim 27, including coating the surface of the detector that receives incident radiation with an anti-reflection (AR) coating to prevent Fresnel reflections therefrom that may otherwise form a complicated coupled multi-cavity structure.

31. A method as claimed in claim 27, including forming the detector as an integral part of the reflector structure.

32. A method as claimed in claim 27, wherein the base layer comprises an integrated circuit.

33. A detector device for detecting incident radiation at particular wavelengths fabricated according to the method as claimed in claim 27.

34. A method as claimed in claim 27, wherein the cavity length corresponds to optical wavelengths in the infrared region.

35. A method as claimed in claim 27, wherein the base layer is a substrate.

36. A method as claimed in claim 35, wherein the substrate is a semiconductor or semiconductor system that is transparent to radiation in the wavelengths to be detected by the detector device.

37. A method as claimed in claim 27, including:
forming the moveable membrane;
suspending the membrane at the periphery thereof with a support structure so that it is disposed in spaced relationship to the base layer;
forming the other reflector on the moveable membrane; and
providing a pair of electrodes to control the movement of the membrane.

38. A method as claimed in claim 37, wherein the electrodes are constituted by the reflectors.

39. A method as claimed in claim 37, wherein the electrodes are juxtaposed with the reflectors, one electrode with the one reflector and the other electrode with the other reflector.

40. A method as claimed in claim 27, including forming the one reflector and the detector so that they are integrated or integral with the base layer.

41. A method as claimed in claim 40, including forming the membrane so that it is suspended by a support structure mounted upon the detector or base layer of the device.

42. A method as claimed in claim 41, including growing a first reflector layer on the surface of the base layer to constitute the one reflector, and depositing the detector thereon so that the first reflector layer is embedded between the base layer and the detector.

43. A method for fabricating a detector device for detecting incident radiation at particular wavelengths, the method including:
providing a base layer of material;
forming one reflector in fixed relationship with respect to the base layer;
forming another reflector in opposed spaced relation to the one reflector so as to form a resonant cavity between the pair of reflectors, the reflectors being disposed a cavity length from each other; and
forming a detector to be disposed within the cavity for absorbing incident radiation therein for detection purposes, wherein the detector is formed towards one end of the cavity and adjacent one of the one or the other reflector,
wherein the method further comprises:
forming a sacrificial layer of a prescribed material on the base layer, the material having a high etch selectivity for releasing the membrane in a suspended and spaced relationship the base layer, as appropriate;
forming the membrane on the sacrificial layer using a deposition technique characterised by providing the required intrinsic stress in the membrane;
depositing the second reflector layer on the membrane to form the other reflector;
patterning the further layer in accordance with a prescribed membrane geometry;
etching the second reflector layer to achieve the prescribed membrane geometry;
initially etching the sacrificial layer to remove regions thereof down to the base layer, as appropriate, exposed by the etching;
protecting those regions of the sacrificial layer intended to function as the residual support structure of the membrane; and
finally etching the remaining unprotected regions of the sacrificial layer and removing the protection from the support structures to suspend the membrane in spaced relation to the base layer.

44. A method as claimed in claim 43, wherein the membrane is formed of silicon nitride.

45. A method as claimed in claim 43, wherein the sacrificial layer is formed of zinc sulphide.

46. A method as claimed in claim 43, wherein the base layer is a substrate formed from an infrared sensitive material.

47. A method as claimed in claim 43, wherein the base layer is a readout substrate formed of silicon.

48. A method as claimed in claim 43, wherein the deposition technique for forming the membrane is plasma enhanced chemical vapour deposition (PECVD).

49. A method as claimed in claim 43, wherein the protection of the support structures is provided by photoresist.

50. A method as claimed in claim 43, wherein the sacrificial layer is initially etched using an anisotropic etching process.

51. A method as claimed in claim 50, wherein the anisotropic etching process for initially etching the sacrificial layer involves dry etching.

52. A method as claimed in claim 43, wherein the remaining unprotected regions of the sacrificial layer are finally etched using an isotropic etching process.

53. A method as claimed in claim 52, wherein the isotropic etching process involves a final release wet etch that undercuts the remaining membrane.

54. A method as claimed in claim 43, wherein the second reflector layer is etched using an anisotropic etching process.

55. A method as claimed in claim 54, wherein the anisotropic etching process for the second reflector layer involves dry etching.

56. A method as claimed in claim 55, wherein the thy etching involves plasma etching.

57. A method as claimed in claim 56, wherein the plasma etching is reactive ion etching.

58. A method for fabricating a detector device for detecting incident radiation at particular wavelengths, the method including:
providing a base layer of material
forming one reflector in fixed relationship with respect to the base layer;

forming another reflector in opposed spaced relation to the one reflector so as to form a resonant cavity between the pair of reflectors the reflectors being disposed a cavity length from each other; and forming a detector to be disposed within the cavity for absorbing incident radiation therein for detection purposes, wherein the detector is formed towards one end of the cavity and adjacent one of the one or the other reflector, wherein the method further comprises:

forming the one reflector and the detector so that they are integrated or integral with the base layer;

growing a first reflector layer on the base layer to form the one reflector of the cavity resonator;

growing an active detector layer on the one reflector to form one side of the detector device;

forming a second reflector layer on a further base layer to form the other reflector of the cavity resonator and the other side of the detector device;

conjoining the sides of the detector device relative to each other so that the one reflector is disposed in confronting relationship with the other reflector and the reflectors are spaced apart, with the detector disposed therebetween; and bonding the two sides together to form an integral detector device with the reflectors disposed in spaced apart relationship to each other to form the resonant cavity with the detector disposed therein.

59. A method as claimed in claim 58, wherein the further base layer comprises a readout integrated circuit.

60. A method as claimed in claim 58, wherein the conjoining and bonding involve a flip-chip bonding process.

61. A method as claimed in claim 58, including suspending the other reflector upon the further base layer.

62. A method as claimed in claim 58, including forming the other reflector on, or as, a moveable membrane disposed in opposing, spaced relationship to the further base layer and suspended relative thereto at the periphery of the membrane by a support structure.

63. A method as claimed in claim 58, including forming a support on one side or the other of the detector device to space the reflectors apart when conjoining one side relative to the other.

64. A method as claimed in claim 63, including forming the support from indium bumps.

65. A method as claimed in claim 58, including epitaxially growing the one reflector as a wide bandgap dielectric stack prior to growing the active detector layer or layers.

66. A method as claimed in claim 65, wherein the one reflector is an MCT/cadmium telluride (CdTe) $\lambda/4$ dielectric stack.

67. A detector device for detecting incident radiation at particular wavelengths, comprising:
a base layer of material;
a cavity formed on the base layer, the cavity having a pair of reflectors, one being a first reflector layer disposed in fixed relationship with respect to the base layer and the other being a second reflector layer disposed in opposed spaced relationship to the first reflector layer to form a resonant cavity between the reflector layer, the reflectors being disposed a cavity length from each other; and
a first detector disposed within the cavity to absorb incident radiation therein for detection purposes,
wherein the first detector is disposed towards one end of the cavity and adjacent one of the first or second reflector layers,
the second reflector layer is formed on a moveable membrane disposed in spaced relationship to the base layer and suspended relative thereto at the periphery of the membrane by a support structure,
the first reflector layer and the first detector are integrated or integral with the base layer,
the support structure is mounted upon the first detector or the base layer of the device, and
the first reflector layer is disposed on another detector having a different wavelength sensitivity to incident radiation than the first detector, so that the first reflector layer is interposed between the two detectors, and the other detector is disposed on the base layer.

68. A detector device as claimed in claim 67, wherein th other detector is of a shorter wavelength sensitivity to incident radiation to be detected than the first detector, and the base layer is a substrate.

69. A detector device as claimed in claim 67, including another reflector layer juxtaposed with the base layer, and interposed between the other detector and the base layer, to define another cavity between the second reflector layer and the other reflector layer, the cavities being conjunctively tunable by moving the membrane of the second reflector layer.

70. A detector device as claimed in claim 69, wherein the other detector is of a longer wavelength sensitivity to incident radiation to be detected than the first detector.

71. A method for fabricating a detector device for detecting incident radiation at particular wavelengths, the method including:
providing a base layer of material;
forming one reflector in fixed relationship with respect to the base layer;
forming another reflector in opposed spaced relation to the one reflector so as to form a resonant cavity between the pair of reflectors, the reflectors being disposed a cavity length from each other; and
forming a first detector to be disposed within the cavity for absorbing incident radiation therein for detection purposes, wherein the first detector is formed towards one end of the cavity and adjacent one of the one or the other reflector,
wherein the method further comprises:
forming the one reflector and the first detector so that they are integrated or integral with the base layer;
forming the membrane so that it is suspended by a support structure mounted upon the first detector or base layer of the device;
depositing another detector on the base layer;
growing a first reflector layer on the other detector to form the one reflector of the cavity resonator;
depositing the first detector on the first reflector layer and the other detector so that the first reflector layer is interposed between the two detectors; and
forming a second reflector layer in opposing, spaced relationship to the first detector to form the other reflector of the cavity resonator;
wherein the other detector has a different wavelength sensitivity to incident radiation than the first detector.

72. A method as claimed in claim 71, wherein the other detector is of a shorter wavelength sensitivity to incident radiation to be detected than the first detector, and the base layer is a substrate.

73. A method as claimed in claim 71, wherein the other detector is of a longer wavelength sensitivity to incident radiation to be detected than the first detector.

74. A method for fabricating a detector device for detecting incident radiation at particular wavelengths, the method including:
provided a base layer of material;
forming one reflector in fixed relationship with respect to the base layer;
forming another reflector in opposed spaced relation to the one reflector so as to form a resonant cavity between the pair of reflectors, the reflectors being disposed a cavity length from each other, and
forming a detector to be disposed within the cavity for absorbing incident radiation therein for detection purposes, wherein the detector is formed towards one end of the cavity and adjacent one of the one or other reflector,
wherein the method further comprises:
forming the one reflector and the detector so that they are integrated or integral with the base layer;
forming the membrane so that it is suspended by a support structure mounted upon the detector or base layer of the device;
embedding the detector in one side of the base layer;
etching a window in the base layer from the other side thereof down to the detector to reveal the rear thereof;
depositing a first reflector layer on the rear of the detector to form the one reflector of the cavity resonator; and
forming a second reflector layer disposed in opposing relationship to the base layer to form the other reflector of the cavity resonator.

75. A method as claimed in claim 74, including suspending the other reflector upon the base layer.

76. A method for fabricating a detector device for detecting incident radiation at particular wavelengths, the method including:
providing a base layer of material;
forming one reflector in fixed relationship with respect to the base layer;
forming another reflector in opposed spaced relation to the one reflector so as to form a resonant cavity between the pair of reflectors, the reflectors being disposed a cavity length from each other; and
forming a detector to be disposed within the cavity for absorbing incident radiation therein for detection purposes, wherein the detector is formed towards one end of the cavity and adjacent one of the one or the other reflector,
wherein the method further comprises:
forming: (i) a first reflector layer upon one side of a layer of homogeneous material sensitive to the incident radiation at the wavelength(s) to be detected to form the one reflector of the resonant cavity; and (ii) the detector within the layer of homogeneous material with an air gap to expose the detector to the other side of the homogeneous material; the first reflector layer and the detector being formed discretely from the base layer to constitute a first half of the device;
forming: (i) the moveable membrane; and (ii) a second reflector layer to form the other reflector of the resonant cavity thereon; on the base layer so that the second reflector layer, the moveable membrane and the base layer constitute a second half of the device discrete from the first half of the device; and
conjoining the first half and the second half of the device so that the second reflector layer is juxtaposed and bonded to the other side of the layer of homogeneous material; whereby the second reflector layer and the moveable membrane surmounts the air gap and the detector to form the cavity with the detector disposed therein.

77. A method as claimed in claim 76, including:
growing the first reflector layer on one side of the layer of homogeneous material to be distal from the base layer in the end device;
etching the other side of the layer to form a recess that constitutes the air gap of the resultant cavity, the residual material disposed between the recess and the first reflector layer defining the detector; and
juxtaposing the second reflector layer on the other side of the layer of homogeneous material so that it is proximal to the base layer.

78. A detector device for detecting incident radiation at particular wavelengths, comprising:
a base layer of material;
a cavity formed on the base layer, the cavity having a pair of reflectors one being a first reflector layer disposed in fixed relationship with respect to the base layer and the other being a second reflector layer disposed in opposed spaced relationship to the first reflector layer to form a resonant cavity between the reflector layers, the reflectors being disposed a cavity length from each other; and
a detector disposed within the cavity to absorb incident radiation therein for detection purposes,
wherein the detector is disposed towards one end of the cavity and adjacent one of the first or second reflector layers,
the second reflector layer is formed on a moveable membrane disposed in spaced relationship to the base layer and suspended relative thereto at the periphery of the membrane by a support structure,
the first reflector layer and the detector are integrated or integral with the base layer,
the support structure is mounted upon the detector or the base layer of the device, and
the detector together with the first reflector layer is embedded within the base layer on one side thereof so that the detector is exposed on one side of the base layer and the first reflector layer is disposed within the base layer to be integral therewith, and the other side of the base layer having a window therein down to the detector and the first reflector layer to reveal the first reflector layer from the other side of the base layer to enable the passage of radiation therethrough.

79. A method for fabricating a detector device for detecting incident radiation at particular wavelengths, the method including:
providing a base layer of material;
forming one reflector in fixed relationship with respect to the base layer;
forming another reflector in opposed spaced relation to the one reflector so as to form a resonant cavity between the pair of reflectors, the reflectors being disposed a cavity length from each other; and
forming a first detector to be disposed within the cavity for absorbing incident radiation therein for detection purposes, wherein the first detector is formed towards one end of the cavity and adjacent one of the one or the other reflector,
wherein the method further comprises:
forming the one reflector and the first detector so that they are integrated or integral with the base layer;
forming the membrane so that it is suspended by a support structure mounted upon the first detector or base layer of the device;
growing another reflector layer on the base layer to form a further reflector of a second resonator cavity within the device;

depositing another detector on the other reflector layer so that the other reflector layer is interposed between the other detector and the base layer;

growing a first reflector layer on the other detector to form the one reflector of the first resonant cavity within the device;

depositing the first detector on the first reflector layer and the other detector so that the first reflector layer is interposed between the first detector and the other detector; and forming a second reflector layer in opposing, spaced relationship to the first detector to form the other reflector of both cavity resonators;

wherein one cavity is defined between the first reflector layer and the second reflector layer, and another cavity is defined between the other reflector layer and the second reflector layer.

80. A detector device as claimed in claim 15, wherein the support structures are formed of zinc sulphide.

\* \* \* \* \*